United States Patent [19]

Shalom

[11] Patent Number: 5,108,870
[45] Date of Patent: Apr. 28, 1992

[54] POSITIVE-WORKING PHOTORESIST COMPOSITION CONTAINING PURIFIED BROADBAND DYE AND PROCESS OF USING

[75] Inventor: Eitan Shalom, Kefar Sava, Israel

[73] Assignee: Morton International, Inc., Chicago, Ill.

[21] Appl. No.: 561,798

[22] Filed: Aug. 2, 1990

[51] Int. Cl.⁵ .......................... G03F 7/23; G03F 7/30; G03C 1/61
[52] U.S. Cl. ..................... 403/190; 430/165; 430/191; 430/192; 430/193; 430/270; 430/311; 430/326
[58] Field of Search ............... 430/191, 196, 192, 270, 430/190, 311, 326

[56] References Cited

U.S. PATENT DOCUMENTS

| | | | |
|---|---|---|---|
| 4,618,565 | 10/1986 | White et al. | 430/271 |
| 4,828,960 | 5/1989 | Hertog | 430/191 |
| 4,882,260 | 11/1989 | Kohara et al. | 430/191 |
| 4,965,167 | 10/1990 | Salamy | 430/191 |

OTHER PUBLICATIONS

T. R. Pampalone & F. A. Kuyan, Contract Enhancing Additives for Positive Photoresist, J. Electrochem. Soc.: Solid-State Science & Technology, vol. 135, No. 2, pp. 471-476 (Feb. 1988).

*Primary Examiner*—Charles L. Bowers, Jr.
*Assistant Examiner*—Christopher G. Young
*Attorney, Agent, or Firm*—George W. Rauchfuss, Jr.; Gerald K. White

[57] ABSTRACT

Photoresist compositions of this invention comprise a positive photoresist polymer, preferably a novolac polymer, a photoactive component (PAC) and a broadband dye additive with high aqueous alkaline solubility and selected from a dye of the formula:

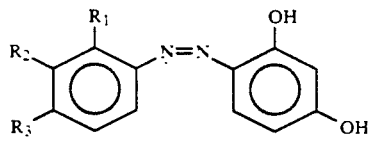

wherein $R_1$, $R_2$ and $R_3$ are each independently selected from the group consisting of hydrogen, alkyl, alkoxy, chloro, bromo and nitro moieties.

21 Claims, No Drawings

POSITIVE-WORKING PHOTORESIST COMPOSITION CONTAINING PURIFIED BROADBAND DYE AND PROCESS OF USING

FIELD OF THE INVENTION

This invention relates to positive acting photoresist compositions and to a method of preparing positive photoresist images on substrates employing the positive acting photoresist compositions. More particularly, this invention relates to positive acting photoresist compositions containing a broadband dye additive which enhances dissolution of exposed resist, decreases the amount of energy required for exposure and controls and improves sidewall angle and reduces reflective notching.

BACKGROUND OF THE INVENTION

Positive acting photoresist compositions which give rise to positive resist images are well known in the art. These compositions generally comprise an alkali-soluble polymer such as a novolac resin and a photoactive component (PAC) containing diazo and keto groups on adjacent positions in a benzenoid structure, such as for example, 2-diazo-1,2-naphthoquinone-4- or 5-sulfonic acid, and possibly a polyhydroxy compound, such as a polyhydroxybenzophenone. Exposure of these photoresist compositions imagewise to actinic light serves to convert the diazo-keto configuration of the PAC to a carboxylic acid-containing moiety. Hence, the portions of photoresist which have been exposed to the actinic radiation are rendered soluble in alkali. The desired photoresist image is then developed using alkaline developers.

The demand for microelectronic and integrated circuits with higher densities is requiring the use of optical lithography for 0.5 to 0.6 micron geometries and requiring a dramatic improvement in photoresist resolution and also requiring more exacting control over the sidewall profiles of the images. Various different approaches could be employed to achieve positive (less than 90°), vertical (90°) or negative (above 90°) sidewall profiles. When printing images employing the aforementioned small geometries, the sidewall angle of the resist image plays an important role. The critical dimension (CD) change between the top and bottom of a 1.2 micron thick resist is 0.042 microns for each degree change of sidewall angle. At 0.5 micron geometries, this is a dramatic 8.4% change. A key to high yield production of such devices at these small geometries is therefore very tight control over sidewall profiles.

Positive photoresists typically form sidewall angles upon development that are less than 90°. This generally occurs because the exposing light has more intensity at the resist surface and less at the bottom substrate surface. Also, the length of contact of the resist to the developer is more at the top than the bottom of the resist layer. Exposure of positive resists to light causes acid formation and bleaching of the PAC, and because of the residual absorption of the remaining PAC through the thickness of the resist a gradient of acid is formed in which the top surface has a higher acid concentration than the bottom. This is in turn, further modified by standing waves. As development of exposed resist proceeds, the top layer is immediately in contact with the developer while the bottom contacts the developer only when the developer reaches that thickness, a typical time difference of 30 to 60 seconds. These two factors contribute to positive sidewall angles of less than 90°. These two factors can only be minimized, since they exist in every positive photoresist, but not eliminated.

The only way to counteract the formation of a positive sidewall angle is through increased surface inhibition of the resist or the formation of an increasing dissolution gradient through the resist thickness. This can be done by developer treatment before exposure, by UV flood exposure while the resist is heated wherein crosslinking occurs in the top layer of resist, or by special design of the resist components that have this feature built into the resist formulation. The most desirable sidewall profile in microlithography during normal processes is vertical or as close to vertical as possible. This sidewall angle allows easy inspection and measurement, and helps in image transfer to the substrate during plasma etch. Keeping the sidewall angle as close to vertical as possible across various exposure energies and various focus settings is a challenge of every resist manufacturer and the desire of every advanced user.

Moreover, a further problem is encountered due to the presence of reflected light during the imagewise exposure of the photoresists. Reflections off layers, such as metallized layers or resist surface irregularities, results in fine lines disappearing. Conventional photoresists are very susceptible to such surface reflections which destroy or degrade the pattern created in the photoresist during imagewise exposure of the photoresist. Another problem caused by the aforesaid is reflective notching or undercutting of the sidewalls due to light scattering from reflective topography.

It is therefore an object of this invention to provide photoresist compositions which eliminate or substantially eliminate undercutting or reflective notching due to light scattering from photoresist topography. A further object of this invention is to provide photoresist compositions which control sidewall profiles to essentially vertical, increase exposure latitude and reduce or substantially eliminate undercutting or reflective notching, especially for photoresists employed to produce devices of small geometries of about 0.5–0.6 microns.

SUMMARY OF THE INVENTION

Photoresist compositions of this invention comprise a positive photoresist polymer, preferably a novolac polymer, a photoactive component (PAC) and as the sole due component a broadband dye additive with high aqueous alkaline solubility and selected from a dye of the formula:

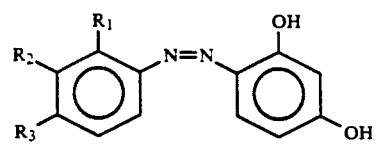

wherein $R_1$, $R_2$ and $R_3$ are each independently selected from the group consisting of hydrogen, alkyl, alkoxy, chloro, bromo and nitro moieties. The dye will preferably have less than about 10 ppm of metallic impurities and less than about 1% by weight of organic impurities. Generally, the amount of dye employed will be from about 0.5 to about 1% by weight for layers on polysilicon, oxide and the like substrates and generally from about 1.0 to about 1.5% by weight for layers on metal substrates or for resists compositions with severe notching tendencies.

DETAILED DESCRIPTION OF THE INVENTION

The broadband (i-, h-, and g- line) dye additives of this invention are dyes with high aqueous alkaline solubility. The dyes create two opposing effects on dissolution of exposed resist. Since they are aqueous alkaline soluble dyes they increase solubility in the bulk resist. Their absorbance, which is in both g- and i- line reduces the amount of light which penetrates through the film, thus less decomposition of the PAC molecules occurs and less formation of acid takes place. This reduces the solubility of the exposed photoresist film.

Preferred dyes for use in accordance with this invention comprise those dyes of the aforementioned formula wherein $R_1$, $R_2$ and $R_3$ are each independently selected from hydrogen, alkyl ($C_1$–$C_4$) and alkoxy ($C_1$–$C_4$), most preferably methyl and methoxy.

As examples of such broadband dye additives there may be mentioned the following exemplary dyes of the hereinbefore set forth formula.

TABLE I

| | $R_1$ | $R_2$ | $R_3$ | λ max (nm) | Relative Abs. g-line/i-line in film |
|---|---|---|---|---|---|
| a) | H | H | H | 387 | 0.75 |
| b) | CH₃ | H | CH₃ | 387 | 1.12 |
| c) | OCH₃ | H | H | 411 | 1.44 |
| d) | H | OCH₃ | H | 396 | 0.922 |
| e) | H | H | OCH₃ | 390 | 1.04 |
| f) | OCH₃ | H | OCH₃ | 405 | 1.85 |

Commercially available sources of such dyes are highly impure. For example, compound a) above, is Sudan Orange G, namely 1-phenylazo-2,4-dihydroxybenzene and is a dye widely used in dying of fabrics for clothing. Sudan Orange G dye commercially available is generally only about 70 to 80% pure and is not highly soluble in standard photoresist solvents and tends to crystallize. Also, such impure dye tends to slow down the photoresist by as much as 2X. It has been discovered that residual organic impurities, such as residual amine, and metal ion contamination in the impure dye are not compatible with the photoresist and the characteristics desired. Residual amines will react with the acid formed in the photochemical reaction of the PAC in the exposed photoresist, especially if a post exposure bake is incorporated to the process. Photospeed will slow down dramatically by such contamination, therefore an essentially amine-free dye is necessary. Accordingly, the organic impurities in the dyes should be less than about 1% by weight.

Also, commercially available sources of such dyes, such as Sudan Orange G, are made using the sodium salt of resorcinol and will generally contain from between 1000–5000 ppm sodium, potassium and iron. However, for use in this invention, metal ion contamination of the dye should be no more than about 10 ppm, preferably less than about 1 ppm, of any metallic component.

Accordingly, the dyes to be used in this invention must be purified to contain less than about 1% by weight organic impurities and less than about 10 ppm, preferably less than about 1 ppm, metal impurities.

Generally the dyes may be purified by filtering out organic insolubles and solubilizing metals and amines with an acid such as HCl. For example, commercially available Sudan Orange G dye may be purified as follows. Ten grams of crude dye are dissolved in 90 grams ethanol. The insolubles are filtered out using a Buchner funnel. The solution is acidified using 1 gram hydrochloric acid (36%). The solution is then poured into 1 liter of D.I. water. The purified dye is filtered out using a Buchner funnel. Further removal of ionic contamination is achieved by redispersing the dye in 500 ml of water, stirring vigorously for 1 hour, and filtering through a Buchner funnel. The dye is then dried in a vacuum oven for 24 hours at 35° C. The yield is 6.5 grams of 99% by weight pure Sudan Orange G dye containing less than 10 ppm, and usually less than 1 ppm, metal contamination.

The broadband dyes of this invention may be employed with any suitable positive photoresist such as alkali soluble novolac resins obtained from a phenolic compound, e.g. phenol and cresol, and an aldehyde compound, e.g. formaldehyde. Examples of such positive photoresists include OFPR 800 of Dynachem Division of Morton International, Inc., HPR 204 and HPR 206 of Hunt Chemical Company, EK 809 of KTI Company, AZ1470 and AZ1450J of the Shipley Company, and Ultramac ® EL 2015 of MacDermid Incorporated.

An especially preferred positive photoresist for use with the broadband dye additives of this invention is a positive photoresist which comprises in admixture, (a) a light-sensitive novolac resin and (b) a non-light-sensitive novolac resin, in a weight ratio of (a) to (b) of from about 1:1 to about 1:10, and wherein the light-sensitive novolac resin comprises the product of reaction of two reactants, a first reactant consisting of a 2-diazo-1,2-naphthoquinone sulfonyl halide and a second reactant consisting of a novolac resin derived from a phenol component consisting essentially of greater than 90% by weight of para-alkyl substituted phenol, the second reactant having an average molecular weight in the range of about 500 to about 1500, and wherein the reaction is carried out using a ratio of moles of the first reactant per hydroxyl group in the second reactant of from about 1:1 to about 1:5. The aforementioned EL 2015 photoresist is an example of such a preferred photoresist.

Examples of two especially preferred photoresist compositions of this invention are the following, in which the parts are part by weight.

| Ultramac ® EL2015-24 (MacDermid, Inc.) | 99.0 parts |
|---|---|
| Sudan Orange G, purified | 1.0 part |
| and | |
| Ultramac ® EL2015-24 (MacDermid, Inc.) | 99.5 parts |
| Sudan Orange G, purified | 0.5 parts |

The positive-working photoresist composition of the invention is usually used in the form of a solution prepared by dissolving the above described novolac resin, any PAC and as the sole dye component the broadband dye in an organic solvent. Suitable organic solvents include ketones, e.g. acetone, methyl ethyl ketone, cyclohexanone and isoamyl ketone, polyhydric alcohols and derivatives thereof, e.g. ethyleneglycol, ethyleneglycol monoacetate, monomethyl, monoethyl, monopropyl, monobutyl and monophenyl ethers of diethyleneglycol or diethyleneglycol monoacetate and the like, cyclic ethers, e.g. dioxane, and esters, e.g. ethyl lactate, methyl acetate, ethyl acetate and butyl acetate. These organic solvents can be used either singly or as a mixture of two kinds or more according to need. Most preferably, the organic solvent employed is ethyl lactate which improves the solubility of the broadband dye in the photoresist composition.

The procedure for forming a patterned photoresist layer using the inventive photoresist composition may be any conventional one. For example, the surface of a substrate body such as a semiconductor silicon wafer is coated with the inventive photoresist composition in the form of an organic solution by use of a suitable coating machine such as spinners followed by drying to form a uniform photoresist layer thereon, which is then exposed pattern-wise to light on a minifying projector or a suitable apparatus for exposure through a photomask bearing a desired pattern followed by development using a developing solution such as an aqueous solution of an organic base so that the photoresist layer is selectively dissolved away on the areas where the photoresist composition has been imparted with increased solubility in the developing solution as a result of exposure to light to give a high-fidelity minified reproduction of the pattern on the photomask. Advantageously, the thus reproduced pattern is a very accurate reproduction of the photomask pattern to the utmost fineness having a line width in the submicron range with dimensional accuracy, and excellent sidewall profiles essentially free of reflective notching.

The inventive positive-working photoresist composition may be admixed optionally with various kinds of known additives having compatibility with the essential ingredients and conventionally used in photoresist compositions such as auxiliary resins, plasticizers, stabilizers, coloring agents to serve for further increasing the visibility of the patterned image after development, and so on.

The advantage of employing the broadband dye additive in positive photoresist compositions in accordance with this invention is illustrated in the following representative examples in which purified Sudan Orange G dye containing less than 1% by weight organic impurities and less than about 10 ppm metal contaminants and obtained in the purification procedure described hereinbefore, is employed as the dye. The photoresist employed is the dual purpose (g-, i- line) positive resist Ultramac® EL2015. A full load of dye, designated AN, is an amount to double the absorption of film in i-line, i.e. the absorption of the dye is equal to the absorption of the PAC. Dye cuts of 25, 50 and 75% (0.25 AN, 0.5 AN and 0.75 AN) were prepared by mixing the appropriate amount of dyed resist with undyed resist. The developer employed in the examples is a wetted developer suitable for double puddle development, namely MF81A from MacDermid Inc. and was employed at two different concentrations, i.e. 50% and 47%.

The examples were conducted using two different i-line exposure tools: ASM PAS2500 .40NA and GCA Autostep 200 .45NA. Wafers were spun to give 1.022 micron thickness, which is a minimum in the i-line swing curve for EL2015. Feature sizes investigated in this study were 0.6 micron. Soft bake and post exposure bakes were done on automatic track equipment. The hot plate temperature was measured with a thermocouple and baking time was always 50 seconds. RS-1 ™ software was use to analyze the results a statistical experiment design for the undyed resist process evaluation.

As mentioned previously, this dye creates two opposing effects on dissolution of exposed resist. Since it is an aqueous alkaline soluble dye, it increases solubility in the bulk resist. Its absorbance, which is in both g- and i-line, reduces the amount of light which penetrates through the film, thus less decomposition of PAC molecules occurs and less formation of acid takes place. This reduces the solubility of the exposed film. The results of these two contradicting effects are seen mainly in the energy to clear (Eo) and exposure energy required for critical dimensions CD's, as shown in Table II, where AN represents a full dye load of dye.

TABLE II

| Comparative data for EL2015 with dye | | | | | |
|---|---|---|---|---|---|
| | Undyed | .25 AN | .5 AN | .75 AN | AN |
| 1. Eo (mJ/cm$^2$) | 63 | 57 | 54 | 59 | 70 |
| 2. Gamma | 2.2 | 2.0 | 2.1 | 2.0 | 2.0 |
| 3. EE$_{CD}$ (mJ/cm$^2$) 0.6 um 1/s* | 75.2 | 80.0 | 90.0 | 94.4 | 107.2 |
| 4. Sidewall angle* | 90.0 | 89.6 | 89.4 | 87.2 | 86.3 |
| 5. EE$_{CD}$/Eo | 1.19 | 1.40 | 1.66 | 1.60 | 1.53 |
| 6. Swing ratio 50% 81 A** | 1.63 | — | 1.39 | — | 1.27 |
| 7. Swing ratio 47% 81 A** | 1.67 | 1.40 | 1.40 | 1.33 | 1.23 |

Process conditions (1–5): soft bake 110°/50 sec. post exposure bake 110°/50 sec
Develop 50% MF81A double puddle 2 × 47.5 sec
Film thickness: 1.12 um.

Process conditions (6): soft bake/post exposure bake 100°/60 sec
Develop 50% MF81A double puddle 2 × 31.5 sec Process conditions (7): soft bake/post exposure bake 110°/50 sec
Develop 47% MF81A double puddle 2 × 47.5 sec.

*obtained from SEMs.
**defined as Emax at 1.08 um/Emin at 1.02 um.

An examination of the data in Table 2 shows that while the energy to clear (Eo) reaches a minimum at the 0.5 AN level and increases again at higher AN levels, the energy to reach CD's increases continuously. This leads to a change in the ratio EE$_{CD}$:Eo which reaches a maximum of 1.7 at the 0.5 AN level as well. This large difference between EE$_{CD}$ and Eo improves process latitude, especially through increased under exposure latitude. The capability to open 0.45 micron contact holes on a 0.45 AN i-line stepper is possible only with dyed versions of EL2015. The 0.5 AN version would appear to be the ideal dye level for all around processing on both nonreflective and reflective layers as well as on reflective topography on polysilicon, oxide, and the like. The swing curve ratio is reduced to allow better CD control with changing thickness over topography. Reflective notching is largely eliminated, exposure latitude is greatly increased, under exposure latitude is increased and the only sacrifice is a slight reduction of depth of focus (DOF). Similar performance has been noted in g-line as well.

With the dye additives of this invention one can improve sidewall angle and exposure latitude, decrease swing curve ratio and reduce reflective notching.

The full level AN may be needed to give the best results on metal with large topography or severe notching tendencies. However, there will be a noticeable decrease in wall angle and reduction in DOF. Even with the full dye load there is no dramatic change in the exposure energy required to expose the photoresist.

With the foregoing description of the invention, those skilled in the art will appreciate that modifications may be made to the invention without departing from the spirit thereof. Therefore, it is not intended that the scope of the invention be limited to the specific embodiments illustrated and described.

I claim:

1. A positive photoresist formulation which comprises as the sole dye component from about 0.5 to about 1.5% by weight of a purified dye consisting of a dye selected from dyes of the formula:

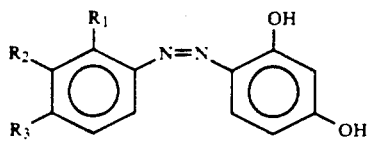

wherein $R_1$, $R_2$ and $R_3$ are each independently selected from the groups consisting of hydrogen, alkyl, alkoxy, chloro, bromo and nitro groups and about 98.5 to about 99.5 weight percent of a photoresist composition comprising a photoresist resin and a photoactive compound, and wherein the purified dye contains less than about 1% by weight of organic impurities and less than about 10 ppm metal contaminants.

2. A positive photoresist formulation of claim 1 wherein $R_1$, $R_2$ and $R_3$ are each independently selected from the groups consisting of hydrogen, methyl and methoxy groups.

3. A positive photoresist formulation of claim 1 wherein the photoresist composition comprises a novolac resin.

4. A positive photoresist formulation of claim 3 wherein the photoresist composition comprises in admixture, (a) a light-sensitive novolac resin and (b) a non-light-sensitive novolac resin, in a weight ratio of (a) to (b) of from about 1:1 to about 1:10, and wherein the light-sensitive novolac resin comprises the product of reaction of two reactants, a first reactant consisting of a 2-diazo-1,2-naphthoquinone sulfonyl halide and a second reactant consisting of a novolac resin derived from a phenol component consisting essentially of greater than 90% by weight of para-alkyl substituted phenol, the second reactant having an average molecular weight in the range of about 500 to about 1500, and wherein the reaction is carried out using a ratio of moles of the first reactant per hydroxyl group in the second reactant of from about 1:1 to about 1:5.

5. A positive photoresist formulation of claim 1 wherein the dye is present in an amount of from about 0.5 to about 1.0% by weight.

6. A positive photoresist formulation of claim 3 wherein the dye is present in an amount of from about 0.5 to about 1.0% by weight.

7. A positive photoresist formulation of claim 2 wherein the dye is present in an amount of from about 0.5 to about 1.0% by weight.

8. A positive photoresist formulation of claim 4 wherein the dye is present in an amount of from about 0.5 to about 1.0% by weight.

9. A positive photoresist composition of claim 1 in the form of a solution in ethyl lactate solvent.

10. A positive photoresist composition of claim 3 in the form of a solution in ethyl lactate solvent.

11. A positive photoresist composition of claim 2 in the form of a solution in ethyl lactate solvent.

12. A positive photoresist composition of claim 4 in the form of a solution in ethyl lactate solvent.

13. A positive photoresist formulation of claim 1 wherein the dye is 1-phenylazo-2,4-dihydroxybenzene.

14. A positive photoresist formulation of claim 3 wherein the dye is 1-phenylazo-2,4-dihydroxybenzene.

15. A positive photoresist formulation of claim 2 wherein the dye is 1-phenylazo-2,4-dihydroxybenzene.

16. A positive photoresist formulation of claim 4 wherein the dye is 1-phenylazo-2,4-dihydroxybenzene.

17. A positive photoresist formulation of claim 2 wherein the dye contains less than about 1 ppm metal contaminants.

18. A method of preparing a positive photoresist image on a substrate which comprises applying to said substrate a coating of a positive photoresist formulation of claim 1, exposing the coating imagewise to ultraviolet radiation and developing the positive image using an alkaline developer.

19. A method of preparing a positive photoresist image on a substrate which comprises applying to said substrate a coating of a positive photoresist formulation of claim 3, exposing the coating imagewise to ultraviolet radiation and developing the positive image using an alkaline developer.

20. A method of preparing a positive photoresist image on a substrate which comprises applying to said substrate a coating of a positive photoresist formulation of claim 2, exposing the coating imagewise to ultraviolet radiation and developing the positive image using an alkaline developer.

21. A method of preparing a positive photoresist image on a substrate which comprises applying to said substrate a coating of a positive photoresist formulation of claim 4, exposing the coating imagewise to ultraviolet radiation and developing the positive image using an alkaline developer.

* * * * *